(12) United States Patent
Mostafazadeh et al.

(10) Patent No.: US 6,984,866 B1
(45) Date of Patent: Jan. 10, 2006

(54) FLIP CHIP OPTICAL SEMICONDUCTOR ON A PCB

(75) Inventors: Shahram Mostafazadeh, San Jose, CA (US); Joseph O. Smith, Morgan Hill, CA (US); Matthew D. Penry, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 350 days.

(21) Appl. No.: 10/391,283

(22) Filed: Mar. 17, 2003

(51) Int. Cl.
*H01L 31/0203* (2006.01)

(52) U.S. Cl. ............... 257/433; 257/434; 257/778; 257/787; 438/64; 438/108; 438/116; 438/126

(58) Field of Classification Search ........... 257/100, 257/433, 434, 680, 681, 778; 438/25, 26, 438/64, 108, 116
See application file for complete search history.

(56) References Cited

U.S. PATENT DOCUMENTS

| | | | | |
|---|---|---|---|---|
| 4,760,440 | A * | 7/1988 | Bigler et al. | 257/680 |
| 5,867,368 | A * | 2/1999 | Glenn | 361/783 |
| 6,040,612 | A * | 3/2000 | Minami et al. | 257/432 |
| 6,396,116 | B1 * | 5/2002 | Kelly et al. | 257/432 |
| 6,413,474 | B1 * | 7/2002 | Igel et al. | 422/82.05 |
| 6,518,656 | B1 * | 2/2003 | Nakayama et al. | 257/680 |
| 6,566,745 | B1 * | 5/2003 | Beyne et al. | 257/680 |
| 6,765,236 | B2 * | 7/2004 | Sakurai | 257/98 |
| 6,787,869 | B1 * | 9/2004 | Vittu | 257/434 |

FOREIGN PATENT DOCUMENTS

JP 08084278 A * 3/1996

OTHER PUBLICATIONS

Definitions of "charge coupled device" (CCD) found on the Internet through GOOGLE (four sheets).*
"ShellOP Process Flow," Shellcase Wafer Level Packaging, Oct. 2001, 9 pages.
"ShellOP," downloaded from http://www.shellcase.com/pages/products.asp on Nov. 19, 2002, 3 pages.
"ShellBGA Process Flow," Shellcase Wafer Level Packaging, Nov. 2001, 12 pages.
"Dual Inline Package," downloaded from http://www.tpub.com/neets/book14/57g.htm, on Nov. 15, 2002, 5 pages.
"An Innovative Approach to Wafer-Level MEMS packaging," downloaded from: http://solidstate.articles.printthis.clickability.com on Nov. 19, 2002, 4 pages.
"Packaging Techniques," downloaded from: http://www.tpub.com/neets/book14/57f.htm on Nov. 15, 2002.

* cited by examiner

*Primary Examiner*—John B. Vigushin
(74) *Attorney, Agent, or Firm*—Beyer Weaver & Thomas (57) ABSTRACT

Semiconductor devices and methods for making semiconductor devices. The present invention allows a flip chip assembly to be used with an optical semiconductor device. The optical semiconductor flip chip is positioned over a hole in a PCB such that the imaging area of the optical semiconductor flip chip faces the hole. The hole allows the imaging area to be unobstructed by the PCB. Underfill material can be prevented from going into the hole by erecting a barrier on top of the PCB that surrounds the hole.

14 Claims, 6 Drawing Sheets

FLIP CHIP OPTICAL SEMICONDUCTOR ON A PCB

BACKGROUND OF THE INVENTION

1. Field of the Invention

The present invention relates generally to optical semiconductors more specifically to mounting optical semiconductors on printed circuit boards.

2. Description of the Related Art

There are a wide variety of digital imaging devices that are currently commercially available. The imagers used in these devices typically take the form of an integrated circuit having a charge-coupled devices (CCD) and/or CMOS imagers. CCDs and CMOS imagers are specially made integrated circuits that respond to light. CCDs are used to capture image data in devices such as telescopes, bar code readers, digital still and video cameras and scanners.

Packaging assemblies are often costly aspect of optical semiconductor chips. The imagining area of an optical semiconductor chip must be generally remain unobstructed, which often requires expensive or intricate packaging designs.

Figure 1:
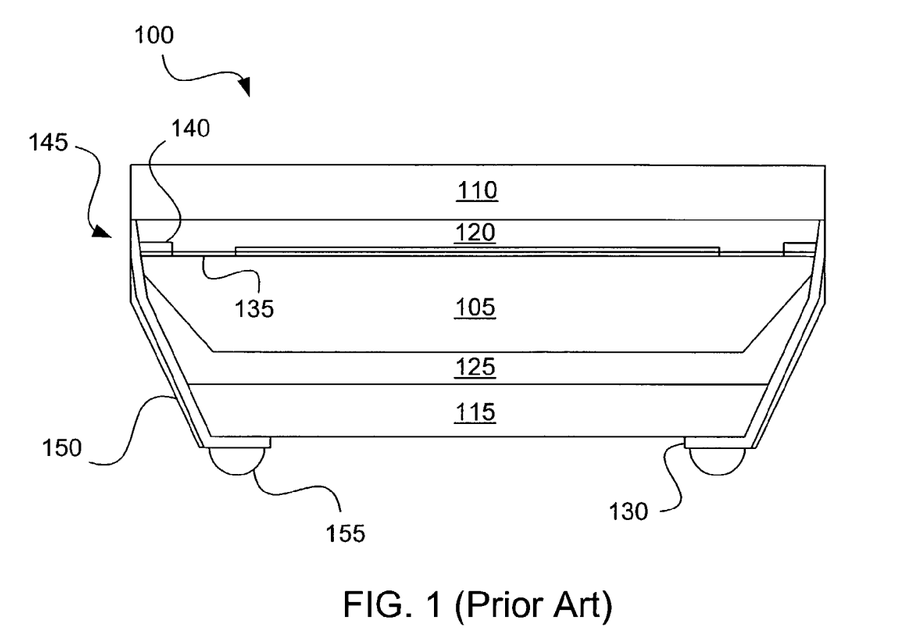
FIG. 1 is a cross sectional view of a prior art ShellOP package.

One wafer level packaging approach that has been used in packaging integrated circuits having optical components is the chip-scale "ShellOP" type packaging technology developed by Shellcase Ltd. of Israel. A cross-sectional view of a typical ShellOP package is shown by way of example in FIG. 1. As seen therein, IC package 100 is an optically active device based on the ShellOP packaging design. The packaging process employs standard wafer processing techniques such as grinding, photolithography, etching, metal deposition, plating, and dicing. Unlike many packaging methods, the Shellcase process requires no lead frames, or wire bonding. The optical package comprises semiconductor bulk 105, which is held in placed in between a top glass plate 110 and a lower glass plate 115 by epoxy 120 and 125, respectively. Inverted external leads 130 are electrically connected to die terminals 135 by trace contacts 140 at junctions 145. Junction 145 is sometimes referred to as a T-junction, and contact 140 as a T-junction contact. External leads 130 are coated with a protective solder-mask 150. Solder-mask 150 is a dielectric material that electrically isolates leads 130 from external contact, and protects the lead surface against corrosion. Contacts 155 are attached to the bottom end of leads 130, and are suitable for printed circuit board (PCB) mounting by known methods. Contacts 155 may be formed by known methods such as solder-balls or plating, and may be suitably shaped for PCB mounting.

Although the ShellOP and other existing packaging processes have proven to be useful, they are costly to implement. Other well-known packages are cheaper, but have not been used because the assemblies result in an obstructed imaging area. For example, although a flip chip optical semiconductor is cheaper to make, they would typically result in the imaging area being face-down and obstructed by the PCB.

SUMMARY OF THE INVENTION

The present invention provides semiconductor devices and methods for making semiconductor devices. In one embodiment, a semiconductor device includes a PCB, a optical semiconductor, underfill material and a barrier. The PCB, a substrate adapted to receive the optical semiconductor, has an opening that extends from the top of the PCB to the bottom of the PCB. The optical semiconductor is attached to the PCB such that the optical semiconductor's imaging area is facing the opening and substantially unobstructed by the PCB. The underfill material is dispensed in between the optical semiconductor and the PCB. The barrier is located in between the optical semiconductor and the PCB, such that the barrier surrounds the opening in the top of the PCB and is adapted to prevent the underfill material from entering the opening.

In another embodiment, a semiconductor device is constructed by first providing a PCB that has an opening that extends from the top of the PCB to the bottom of the PCB. Then a barrier is dispensed around the opening on the top of the PCB. Afterwards, a flip chip optical semiconductor can be coupled to the top of the PCB such that the flip chip optical semiconductor covers the opening. Then underfill material can be dispensed in between the flip chip optical semiconductor and the PCB, whereby the barrier prevents the underfill material from going into the opening. Finally, a transparent cover can be attached to the bottom of the PCB.

BRIEF DESCRIPTION OF THE DRAWINGS

The invention may best be understood by reference to the following description taken in conjunction with the accompanying drawings in which.

It is to be understood that, in the drawings, like reference numerals designate like structural elements. Also, it is understood that the depictions in the figures are not necessarily to scale.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The present invention allows a flip chip assembly to be used with an optical semiconductor device. The optical semiconductor flip chip is positioned over a hole in a PCB such that the imaging area of the optical semiconductor flip chip faces the hole. The hole allows the imaging area to be unobstructed by the PCB. Underfill material can be prevented from going into the hole by erecting a barrier on top of the PCB that surrounds the hole.

Figure 2A:
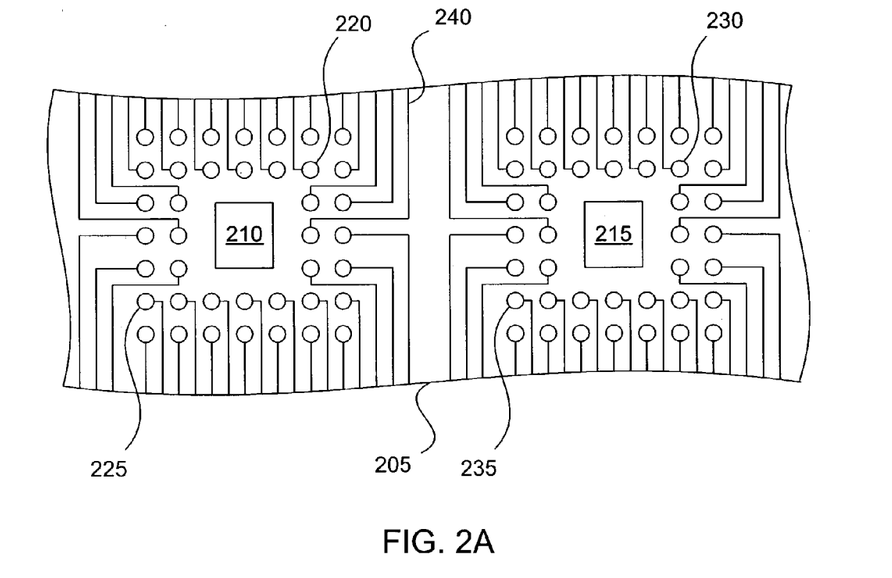
FIG. 2A is a plan view of a PCB with two openings.
Figure 2B:
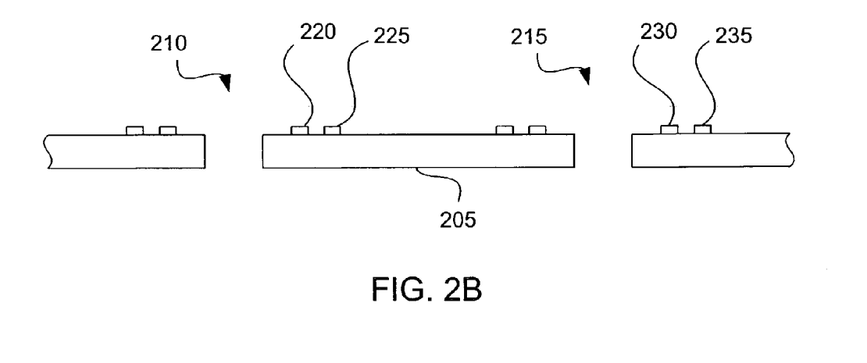
FIG. 2B is a cross sectional view of the PCB illustrated in FIG. 2A.

FIG. 2A is a diagrammatic plan view of an exemplary printed circuit board (PCB) 205 that can be used in the present invention. FIG. 2B is a diagrammatic cross sectional view of the PCB 205. A PCB is a substrate on which chips and other electronic components are placed, interacting with each other through traces. The PCB 205 can be of any suitable material including fiberglass-resin laminate such as standard FR4, ceramic, or flex tape. The PCB 205 has two openings 210 and 215 that will eventually be used to allow an optical semiconductor to have an unobstructed imaging area. The openings 210 and 215 can be of any shape, but will typically be of the same shape as the optical semiconductors' imaging portions. It should be readily appreciated that the number of optical devices will depend upon the particular requirements of the final device. Some PCBs might only have a single optical semiconductor and other PCBs might have many more optical semiconductors.

The PCB 205 additionally has two rows of landing pads 220, 225, 230 and 235 per opening 210 and 215. Landing pads are the sites that are used to connect the optical semiconductors with the rest of the system via traces 240. Although two rows of landing pads 220, 225, 230 and 235 are shown, the number and placement of landing pads will depend upon the specifications of the optical semiconductors.

Figure 3A:
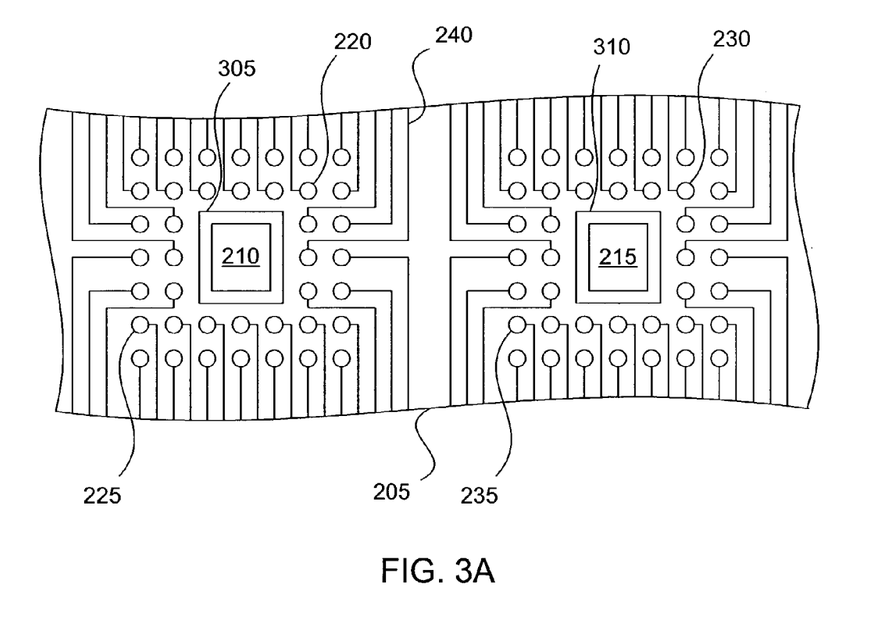
FIG. 3A is a plan view of the PCB of FIG. 2 with barriers surrounding the two openings.
Figure 3B:
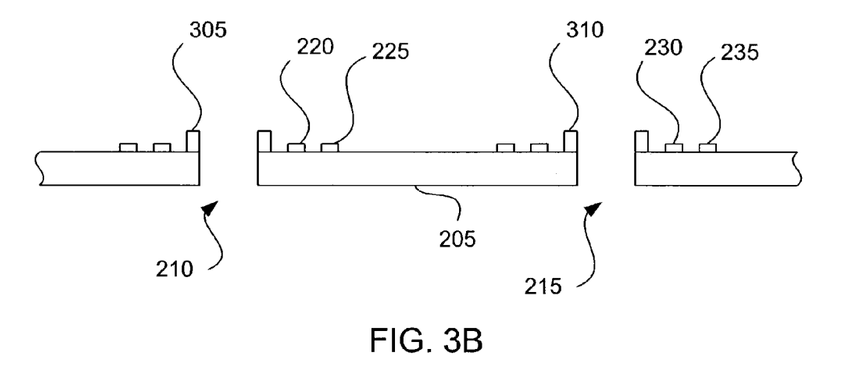
FIG. 3B is a cross sectional view of the PCB illustrated in FIG. 3A.

FIG. 3A is a diagrammatic plan view and FIG. 3B is a diagrammatic cross sectional view of the PCB 205 after barriers 305 and 310 have been deposited around the openings 210 and 215. The barriers 305 and 310 are preferably a B-stageable thermosetting resin.

B-stageable thermosetting resins have three stages: A-stage, B-stage and C-stage. The A-stage is the condition of low molecular weight of a condensation resin polymer during which the resin is readily soluble and fusible. The B-stage is the condition of a partially cured resin polymer when it is more viscous, with higher molecular weight than in the A-stage, being incompletely soluble but plastic and heat fusible. The C-stage is the condition of a resin polymer when it is completely polymerized (in the solid state), with maximum molecular weight, being insoluble and infusible.

Working with the barriers 305 and 310 while they are still somewhat pliable are preferred because they allow a larger tolerance in the heights of the barriers 305 and 310 than would be necessary if the barriers 305 and 310 were rigid. A large tolerance is desirable to compensate for settling that may occur after optical semiconductors are electrically coupled to their respective landing pads 220, 225, 230 and 235.

It should, however, be appreciated that precise controls of certain parameters will permit accurate prediction of settling and allow the final height requirement of the barriers 305 and 310 to be accurately known. In processes where the final height requirements of the barriers 305 and 310 are known, the barriers can be made of rigid material, or even formed as part of the PCB 205.

Figure 4A:
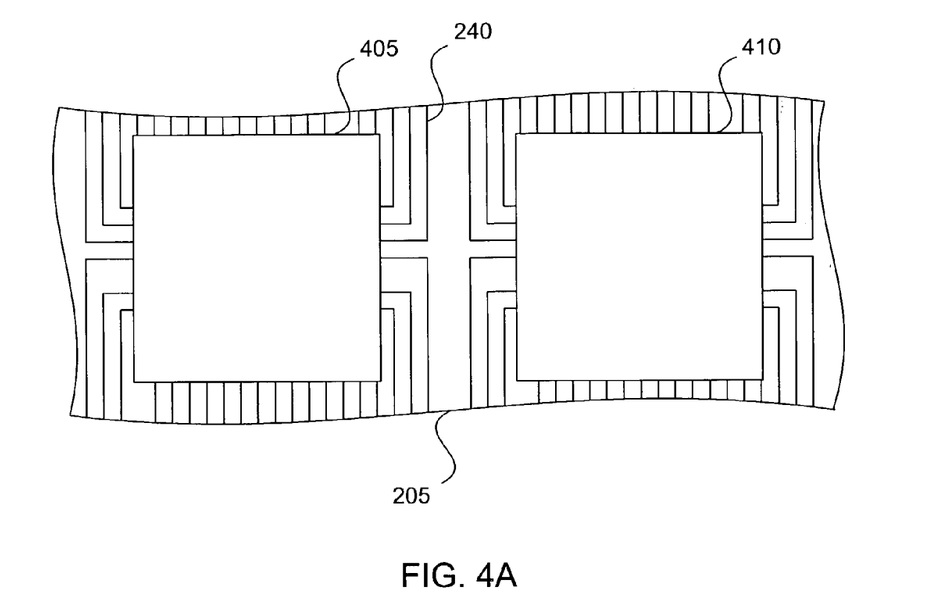
FIG. 4A is a plan view of two flip chips attached to the PCB of FIG. 3.
Figure 4B:
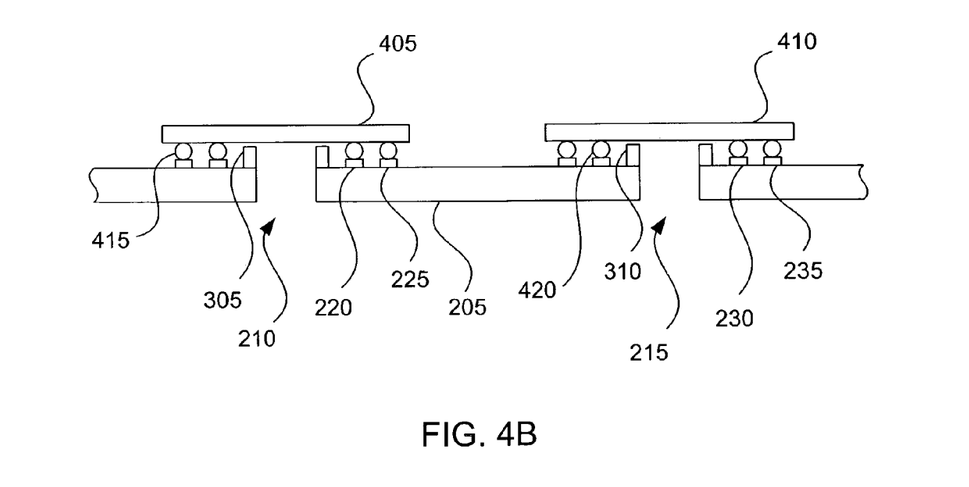
FIG. 4B is a cross sectional view of the assembly illustrated in FIG. 4A.

FIG. 4A is a diagrammatic plan view and FIG. 4B is a diagrammatic cross sectional view of two flip chip imaging dice 405 and 410 that are electrically coupled to the PCB 205 via conductive bumps 415 and 420. A flip chip assembly is generally defined as the direct electrical connection of face-down ("flipped") electronic components onto substrates, such as PCBs, by means of conductive bumps on bond pads.

Common conductive bumps include solder bumps, plated bumps, stud bumps and adhesive bumps. The conductive bumps 415 and 420 can serve several functions in the flip chip assembly. The conductive bumps 415 and 420 provide the electrically conductive path from the flip chip imaging dice 405 and 410 to the PCB 205. The conductive bumps 415 and 420 can also provide thermally conductive paths to carry heat from the dice 405 and 410 to the PCB 205. In addition, the conductive bumps 415 and 420 also provide part of the mechanical mounting of the dice 415 and 420 to the PCB 205.

Figure 5A:
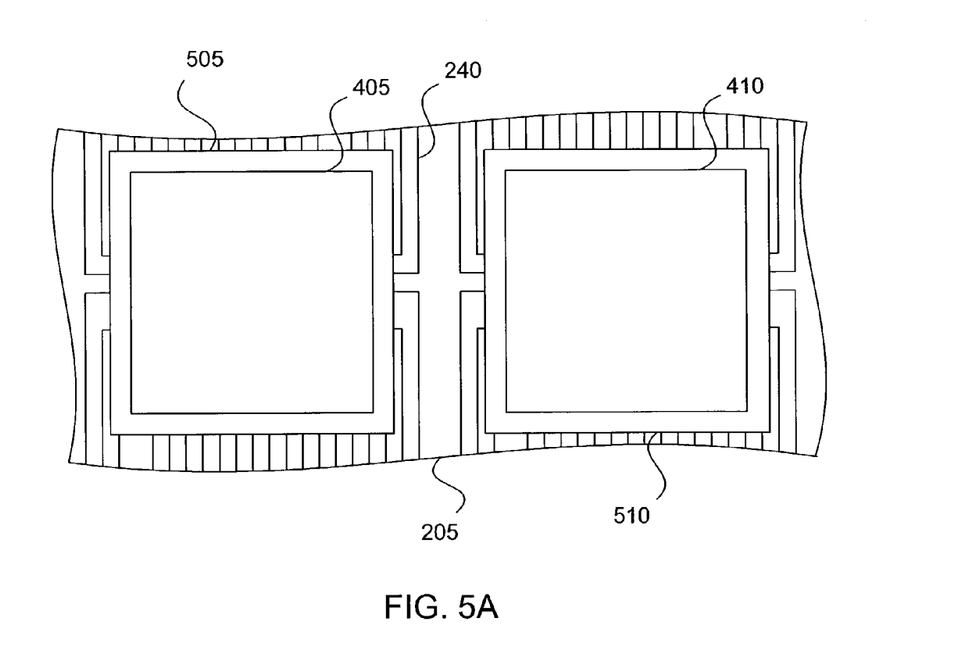
FIG. 5A is a plan view of the assembly of FIG. 4 with underfill material.
Figure 5B:
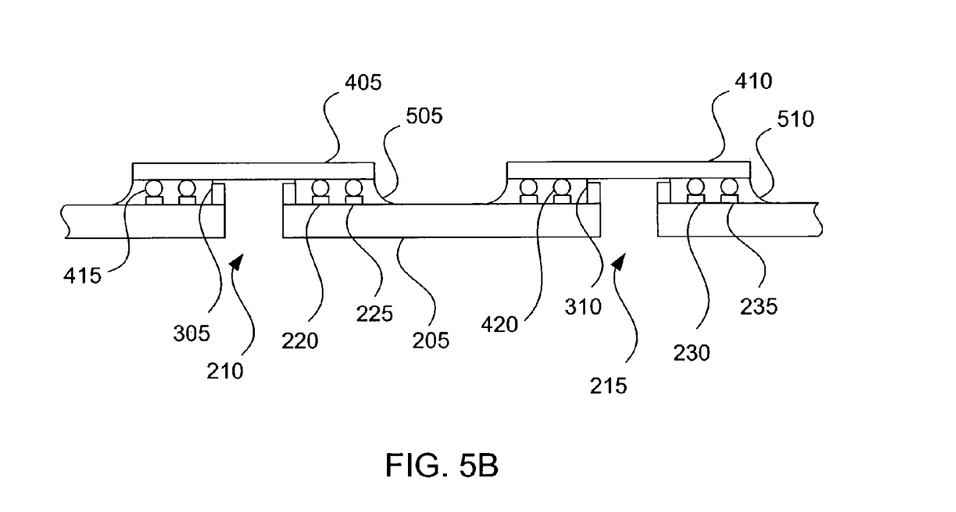
FIG. 5B is a cross sectional view of the assembly illustrated in FIG. 5A.

FIG. 5A is a diagrammatic plan view and FIG. 5B is a diagrammatic cross sectional view of the PCB 205 after underfill material 505 and 510 has been applied. The underfill material 505 and 510 is typically a non-conductive adhesive joining the entire surface of the flip chip imaging dice 405 and 410 to the PCB 205. The underfill 505 and 510 protects the conductive bumps 415 and 420 from moisture or other environmental hazards, and provides additional mechanical strength to the assembly. Additionally, the underfill material 505 and 510 helps compensates for any thermal expansion differences between the flip chip imaging dice 405 and 410 and the PCB 205. The underfill material 505 and 510 mechanically "locks together" the flip chip imaging dice 405 and 410 and the PCB 205, attempting to prevent the differences in thermal expansion from breaking or damaging the electrical connection of the conductive bumps 415 and 420.

The underfill material 505 and 510 may be dispensed in any suitable manner. By way of example, the underfill material 505 and 510 may be needle-dispensed along the edges of each of the flip chip imaging dice 405 and 410. The underfill material 505 and 510 is drawn into the under-chip space by capillary action. However, because of the barriers 305 and 310, the underfill material 505 and 510 does not flow into the openings 210 and 215. It should be appreciated that the barriers 305 and 310 are capable of preventing the underfill material 505 and 510 from passing into the openings 210 and 215 even if the barriers 305 and 310 do not extend all the way from the top of the PCB 205 to the bottom of the flip chip imaging dice 405 and 410. This is because the viscosity of the underfill material 505 and 510, is too high to flow into small spaces via capillary action, which is typically the only mechanism that causes the underfill 505 and 510 material to flow. Therefore, the heights of the barriers 305 and 310 do not need to be equal to the spacing between the flip chip imaging dice 405 and 410 and the PCB 205.

Once the underfill material 505 and 510 is in place, the entire assembly is cured to form a permanent bond. If a B-stageable thermosetting resin were used to form the barriers 305 and 310, the curing process could additionally cure the barriers 305 and 310 at the same time the underfill material 505 and 510 was cured.

Figure 6A:
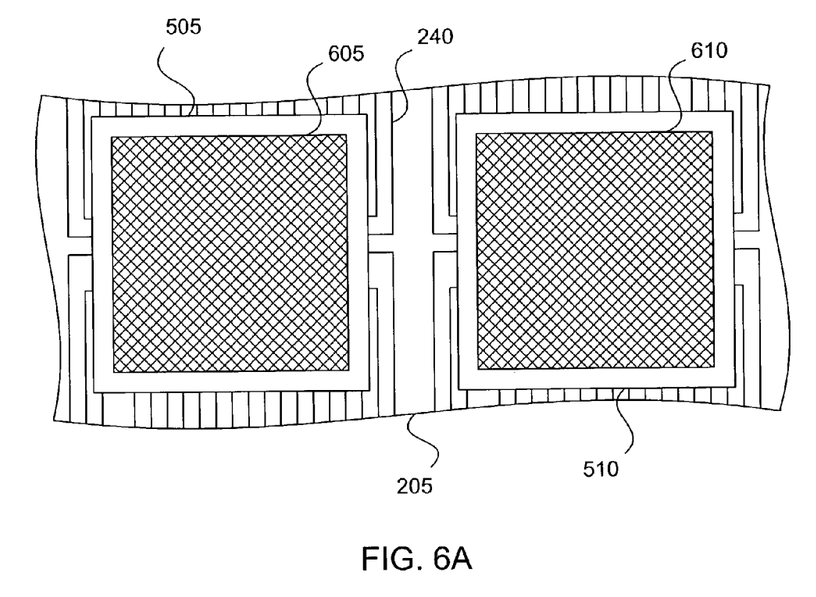
FIG. 6A is a plan view of the assembly of FIG. 5 with opaque protective layers and transparent covers.
Figure 6B:
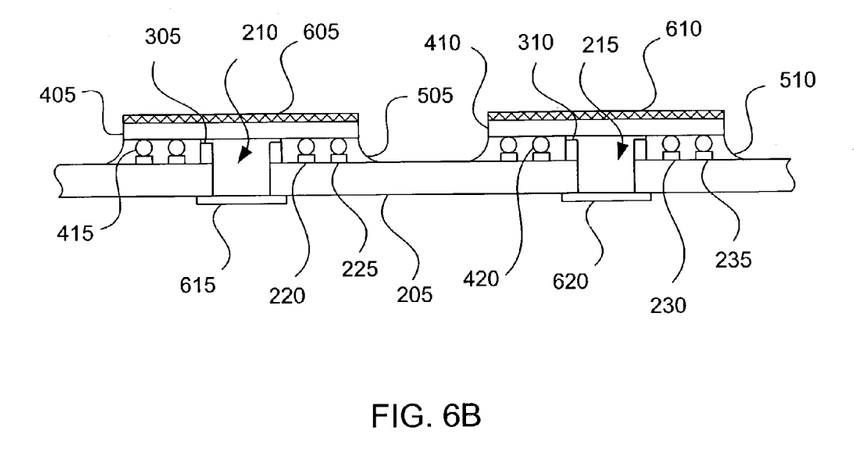
FIG. 6B is a cross sectional view of the assembly illustrated in FIG. 6A.

FIG. 6A is a diagrammatic plan view and FIG. 6B is a diagrammatic cross sectional view of the PCB 205 after opaque protective layers 605 and 610 have been applied to the back surfaces of the flip chip imaging dice 405 and 410 and transparent covers 615 and 620 have been attached to the PCB 205. Imaging chips are typically very susceptible to photo-generated carriers when the surfaces of the imaging chips are exposed to light. In order to prevent photo-generated carriers from interfering with the normal operation of the chips, an opaque cover can be placed on the exposed surfaces of the chips. It will be appreciated by those skilled in the art that the opaque protective layers 605 and 610 can be placed on the flip chip imaging dice 405 and 410 at any point in the fabrication process, even during wafer processing. For example, U.S. Pat. Nos. 6,352,881 and 6,023,094, both of which are incorporated by reference in their entireties for all purposes, disclose methods of applying an opaque protective layer to the top surface and/or bottom surface of the flip chip die during wafer processing.

However, the transparent covers 615 and 620 will typically be applied after the underfill material 505 and 510 has been cured, unless a system is in place to prevent condensation on the transparent covers 615 and 620 during heating. The transparent covers 615 and 620 can be glass or transparent plastic, and can be attached to the PCB 205 via a standard epoxy. Once attached, they protect the imaging portion of the flip chip imaging dice 405 and 410.

Although illustrative embodiments and applications of this invention are shown and described herein, many variations and modifications are possible which remain within the concept, scope, and spirit of the invention, and these variations would become clear to those of ordinary skill in the art. For example, the barriers might be constructed on the chips and not the PCB. Additionally, instead of using a transparent cover, the opening might be filled with a transparent material. Accordingly, the present embodiments are to be considered as illustrative and not restrictive, and the invention is not to be limited to the details given herein, but may be modified within the scope and equivalents of the appended claims.

What is claimed is:

1. A semiconductor device comprising:
   an optical semiconductor leaving an imaging area;
   a PCB having a top, a bottom, and an opening that extends from the top of the PCB to the bottom of the PCB, the optical semiconductor being mounted directly on the top surface of the PCB using one or more electrical contacts formed between the optical semiconductor and the top surface of the PCB, the optical semiconductor being mounted such that the imaging area is facing the opening and substantially unobstructed by the PCB;
   an underfill material that is dispensed in between the optical semiconductor and the PCB; and
   a B-stageable thermosetting resin barrier in between the optical semiconductor and the PCB, such that the barrier surrounds the opening in the top of the PCB and is adapted to prevent the underfill material from entering the opening.

2. The semiconductor device of claim 1, further comprising a transparent cover that is attached to the bottom of the PCB such that the transparent cover entirely covers the bottom of the opening.

3. The semiconductor device of claim 1, wherein the thermosetting resin is an epoxy.

4. The semiconductor device of claim 3 wherein the epoxy is deposited on the PCB in its B-stage.

5. The semiconductor device of claim 1 wherein the barrier is a rigid material.

6. The semiconductor device of claim 5 wherein the barrier is formed as part of the PCB.

7. The semiconductor device of 1 wherein the optical semiconductor is a flip chip.

8. The semiconductor device of claim 1 wherein the PCB is a flex tape substrate.

9. The semiconductor device of claim 1 wherein there is a gap between the barrier and the optical semiconductor.

10. A method for constructing semiconductor devices comprising:
    providing a PCB having a top, a bottom, and an opening that extends from the top of the PCB to the bottom of the PCB;
    mounting a flip chip optical semiconductor directly onto the top surface of the PCB using one or more contacts formed between the top surface of the PCB and the flip chip optical semiconductor; and
    forming a barrier around the opening on the top of the PCB, the barrier comprising a B-stageable thermosetting resin.

11. The method of claim 10, further comprising:
    positioning the flip chip optical semiconductor on the top of the PCB such that optical circuitry on the flip chip optical semiconductor is exposed through the opening of the PCB.

12. The method of claim 11, further comprising,
    dispensing underfill material in between the flip chip optical semiconductor and the PCB, whereby the barrier prevents the underfill material from going into the opening.

13. The method of claim 12, further comprising:
    attaching a transparent cover over the opening on the bottom of the PCB.

14. A semiconductor device comprising:
    a PCB having, a top, a bottom, and an opening that extends from the top of the PCB to the bottom of the PCB;
    a flip chip having optical circuitry mounted directly on the top surface of the PCB such that the optical circuitry on the flip chip is exposed through the opening in the PCB; and
    a barrier adapted to prevent underfill material from entering the opening when the chip is coupled the PCB, the barrier comprising a B-stageable thermosetting resin.

* * * * *

UNITED STATES PATENT AND TRADEMARK OFFICE
CERTIFICATE OF CORRECTION

PATENT NO. : 6,984,866 B1 Page 1 of 1
APPLICATION NO. : 10/391283
DATED : January 10, 2006
INVENTOR(S) : Mostafazadeh et al.

It is certified that error appears in the above-identified patent and that said Letters Patent is hereby corrected as shown below:

In the Claims:

In line 2 of claim 1 (column 5, line 28) change "leaving" to --having--.

Signed and Sealed this

Twelfth Day of September, 2006

JON W. DUDAS
*Director of the United States Patent and Trademark Office*